United States Patent
Asada et al.

(10) Patent No.: US 11,296,741 B2
(45) Date of Patent: Apr. 5, 2022

(54) RECEIVING DEVICE, RECEIVING METHOD, AND RECEIVING SYSTEM

(71) Applicant: PANASONIC INTELLECTUAL PROPERTY MANAGEMENT CO., LTD., Osaka (JP)

(72) Inventors: Yohei Asada, Kanagawa (JP); Tomoyasu Fujishima, Kanagawa (JP); Wataru Miyashita, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 3 days.

(21) Appl. No.: 17/021,384

(22) Filed: Sep. 15, 2020

(65) Prior Publication Data

US 2020/0412399 A1    Dec. 31, 2020

Related U.S. Application Data

(63) Continuation of application No. PCT/JP2019/014367, filed on Mar. 29, 2019.

(30) Foreign Application Priority Data

Mar. 29, 2018    (JP) .............................. JP2018-066238

(51) Int. Cl.
*H04B 1/16*    (2006.01)
*H01Q 1/32*    (2006.01)
(Continued)

(52) U.S. Cl.
CPC ............. *H04B 1/1607* (2013.01); *H01Q 1/32* (2013.01); *H03D 7/165* (2013.01); *H04B 1/10* (2013.01); *H04B 1/302* (2013.01)

(58) Field of Classification Search
CPC . H01Q 1/32; H03D 1/00; H03D 7/165; H04B 1/10; H04B 1/1607; H04B 1/302
See application file for complete search history.

(56) References Cited

U.S. PATENT DOCUMENTS 5,303,415 A    4/1994    Takayama et al.
5,584,066 A *  12/1996   Okanobu ............. H03D 7/1458
                                                      455/302

(Continued)

FOREIGN PATENT DOCUMENTS

JP    03-238929    10/1991
JP    04-297134    10/1992

(Continued)

OTHER PUBLICATIONS

International Search Report (ISR) from International Searching Authority (Japan Patent Office) in International Pat. Appl. No. PCT/JP2019/014367, dated Jun. 4, 2019, along with an English language translation thereof.

(Continued)

*Primary Examiner* — Nader Bolourchi

(74) *Attorney, Agent, or Firm* — Greenblum & Bernstein, P.L.C.

(57) ABSTRACT

A receiving device includes: a frequency mixer that converts a frequency of a reception signal to a baseband; an envelope demodulator; an upper sideband demodulator; and a lower sideband demodulator. Each of the envelope demodulator, (Continued)

the upper sideband demodulator and the lower sideband demodulator demodulates an output from the frequency mixer. The receiving device further includes: a first adder that adds an output from the envelope demodulator and an inverted output obtained by inverting an output from the upper sideband demodulator; a second adder that adds the output from the envelope demodulator and an inverted output obtained by inverting an output from the lower sideband demodulator; and a third adder that adds the output from the envelope demodulator, an inverted output obtained by inverting an output from the first adder, and an inverted output obtained by inverting an output from the second adder, to output a demodulation signal.

18 Claims, 4 Drawing Sheets

(51) Int. Cl.
      *H03D 7/16*       (2006.01)
      *H04B 1/10*       (2006.01)
      *H04B 1/30*       (2006.01)

(56) References Cited

U.S. PATENT DOCUMENTS

| | | | |
|---|---|---|---|
| 2005/0170805 A1* | 8/2005 | Hammes | H03D 7/166 |
| | | | 455/255 |
| 2013/0010977 A1 | 1/2013 | Hirano | |

FOREIGN PATENT DOCUMENTS

| | | |
|---|---|---|
| JP | 2004-254184 | 9/2004 |
| JP | 2010-178227 | 8/2010 |
| WO | 2011/114726 | 9/2011 |

OTHER PUBLICATIONS

Written Opinion of the International Searching Authority (Japan Patent Office) in International Pat. Appl. No. PCT/JP2019/014367, dated Jun. 4, 2019, along with an English language translation thereof.

Matsumoto et al., "Integrated Circuit (IC) for Multi Function Tuner", Fujitsu Ten Technical Journal, No. 33, Apr. 1999, pp. 12-22, English language version thereof.

* cited by examiner

RECEIVING DEVICE, RECEIVING METHOD, AND RECEIVING SYSTEM

CROSS-REFERENCE TO RELATED APPLICATIONS

This application is a continuation of PCT International Patent Application No. PCT/JP2019/014367 filed on Mar. 29, 2019, which claims the benefit of priority of Japanese Patent Application No. 2018-066238 filed on Mar. 29, 2018, the enter contents of which are incorporated herein by reference.

FIELD

The present disclosure relates to a receiving device, a receiving method, and a receiving system that receive a radio signal such as an AM broadcast wave.

BACKGROUND

For example, in a receiving device such as an in-vehicle radio receiver, in order to reduce effect of noises radiated from other electronic apparatuses, a method of mounting a component or circuit for noise countermeasures such as a filter and a noise canceller is adopted. In an in-vehicle AM radio receiver, obstruction of a desired wave caused by an interference wave component other than a broadcast wave signal from a broadcasting station is a problem to be solved in the related art. Since an AM broadcast has a low frequency, the AM broadcast is interfered by various noises such as unnecessary radiation from generators, power transmission lines, and in-vehicle apparatuses. In an in-vehicle AM radio receiver, when a noise radiated mainly from an electronic apparatus of a vehicle, such as a vehicle-mounted motor or an inverter, is mixed in a radio antenna and interferes with a broadcast wave of radio broadcasting, the noise enters a radio audio signal in which a reception signal is demodulated, the sound is harsh and unpleasant.

FIG. 3 is a diagram showing an operation when a noise is mixed in an AM radio receiver. A broadcast wave signal of an AM radio received by an antenna is input to an A/D converter (ADC: Analog to Digital Converter) 501 and is converted into a digital RF (radio frequency band) reception signal. The digital reception signal is input to a frequency mixer (Mixer) 502, and in the frequency mixer 502, the digital reception signal is multiplied by a local signal having the same frequency as a reception broadcast wave output from a Local Oscillator (LO) 503 and is converted into a reception baseband signal of 0 Hz (baseband). The reception baseband signal is input to an AM demodulator 504, is demodulated by envelope detection performed by an envelope detector, for example, and then is input to a D/A converter (DAC: Digital to Analog Converter) 505, is converted into an analog signal, and is output as a sound signal of radio broadcasting.

When a frequency of a pulsed narrow band noise having periodicity is close to a frequency of reception broadcasting, such as a beat noise generated from an alternator or a motor of a wiper, a difference frequency component with a carrier frequency of the reception broadcasting may be demodulated as an audio signal. In the example of FIG. 3, two types of beat noises B1, B2 are superimposed in an AM broadcast wave. When the noises are not mixed, an audio signal S is output as an output signal of the D/A converter 505 after demodulation of the reception signal. When the beat noises are superimposed, a beat noise component is mixed in the output of the AM demodulator 504, and (S+B1+B2) is output as the output signal.

In the related art, as a technique for reducing noises of this type, there is known a noise canceller which includes an analog switch circuit that is supplied with an audio signal containing a pulse noise as an input, is on/off controlled by a control signal, is turned off during a period of the pulse noise, and outputs an audio signal in which the pulse noise is blocked, and a voltage holding circuit that is connected to the analog switch circuit, holds a voltage immediately before turning off as an interpolation voltage during an off period of the analog switch circuit, and interpolates an audio signal from the analog switch circuit with a noise (for example, see JP-A-H03-238929). There is also known that an AM noise canceller is mounted on a multifunctional tuner IC, and a noise of AM radio is removed by focusing on a removal performance of a pulse noise in a weak electric field which is most annoying during reception of the AM radio (for example, see Fujitsu Ten Technical Journal No. 33, issued April, 1999, pp. 12-22).

In the techniques in the related art, as shown in FIG. 4, a harsh noise was removed by cutting a high-frequency component of the pulse noise having a short period such as the beat noise mixed in the reception wave of the AM radio with a predetermined frequency and a threshold of amplitude, and performing complementing with a straight line.

SUMMARY

In recent years, noise sources such as a PWM signal during driving of a motor increases as the vehicle is powered, an importance of the noise countermeasure is increased, and a demand for noise removal performance is also increasing. In order to increase the noise removal effect in the related art, it is necessary to lower a threshold for noise removal. In this case, due to an amplitude level of the threshold and a frequency error, the audio component may be cut together with noise as a side effect, distortion occurs in the audio signal, and a harmonic component is generated. For this reason, there is a problem that a sound information defect occurs in the received audio signal, a distortion feeling or a crackling sound is generated, and the sound quality is deteriorated.

The present disclosure was made in view of the related-art circumstances described above, an object of the present disclosure is to provide a receiving device, a receiving method, and a receiving system capable of removing only a noise without affecting original audio information even when the noise occurs.

The present disclosure provides a receiving device including: a frequency mixer configured to mix a reception signal input thereto and a local signal generated by a local oscillator to convert a frequency of the reception signal to a baseband; an envelope demodulator configured to perform envelope demodulation of an output from the frequency mixer; an upper sideband demodulator configured to demodulate only an upper sideband of the output from the frequency mixer by single sideband demodulation; a lower sideband demodulator configured to demodulate only a lower sideband of the output from the frequency mixer by single sideband demodulation; a first adder configured to add an output from the envelope demodulator and a first inverted output obtained by inverting an output from the upper sideband demodulator; a second adder configured to add the output from the envelope demodulator and a second inverted output obtained by inverting an output from the lower sideband demodulator; and a third adder configured to add the output from the envelope demodulator, a third inverted output obtained by inverting an output from the first adder, and a fourth inverted output obtained by inverting an output from the second adder, to output a demodulation signal.

The present disclosure provides a receiving system including: a reception signal input circuit configured to input a reception signal of a radio wave; a demodulation processor configured to perform demodulation processing of the reception signal; and a sound signal output circuit configured to sound-output a demodulated signal, wherein the reception signal input circuit includes an antenna configured to receive a radio wave of a desired wave and an input signal amplifier configured to amplify a received signal, wherein the sound signal output circuit includes an output signal amplifier configured to amplify a demodulated signal, and a sound output device configured to output an amplified signal as a sound signal, and wherein the demodulation processor includes: a frequency mixer configured to mix the reception signal input from the reception signal input circuit and a local signal generated by a local oscillator to convert a frequency of the reception signal to a baseband; an envelope demodulator configured to perform envelope demodulation of an output from the frequency mixer; an upper sideband demodulator configured to demodulate only an upper sideband of the output from the frequency mixer by single sideband demodulation; a lower sideband demodulator configured to demodulate only a lower sideband of the output from the frequency mixer by single sideband demodulation; a first adder configured to add an output from the envelope demodulator and a first inverted output obtained by inverting an output from the upper sideband demodulator; a second adder configured to add the output from the envelope demodulator and a second inverted output obtained by inverting an output from the lower sideband demodulator; and a third adder configured to add the output from the envelope demodulator, a third inverted output obtained by inverting an output from the first adder, and a fourth inverted output obtained by inverting an output from the second adder, to output the demodulation signal.

The present disclosure provides a receiving method including: causing a frequency mixer to mix a reception signal input thereto and a local signal generated by a local oscillator to convert a frequency of the reception signal to a baseband; causing an envelope demodulator to perform envelope demodulation of an output from the frequency mixer; causing an upper sideband demodulator to demodulate only an upper sideband of the output from the frequency mixer by single sideband demodulation; causing a lower sideband demodulator to demodulate only a lower sideband of the output from the frequency mixer by single sideband demodulation; causing a first adder to add an output from the envelope demodulator and a first inverted output obtained by inverting an output from the upper sideband demodulator; causing a second adder to add the output from the envelope demodulator and a second inverted output obtained by inverting an output from the lower sideband demodulator; and causing a third adder to add the output from the envelope demodulator, a third inverted output obtained by inverting an output from the first adder, and a fourth inverted output obtained by inverting an output from the second adder, to output a demodulation signal.

According to the present disclosure, even when a noise is generated, it is possible to remove only the noise without effecting the original audio information.

DETAILED DESCRIPTION

Hereinafter, embodiments of a receiving device, a receiving method, and a receiving system according to the present disclosure will be described in detail with reference to the accompanying drawings as appropriate. However, detailed descriptions beyond what is necessary may be omitted. For example, detailed descriptions of a subject matter that is previously well-known, as well as redundant descriptions of components that are substantially the same will be omitted in some cases. This is for avoiding unnecessary redundancy in the following description and for facilitating understanding by a person skilled in the art. The accompanying drawings and the following descriptions are provided to help a person skilled in the art to fully understand the present disclosure, and thereby are not intended to limit the subject matter described in the claims.

In the present embodiment, the receiving device, the receiving method, and the receiving system according to the present disclosure are shown as examples, and for example, a configuration example applicable to an AM radio receiver mounted in a vehicle is shown.

Figure 1:
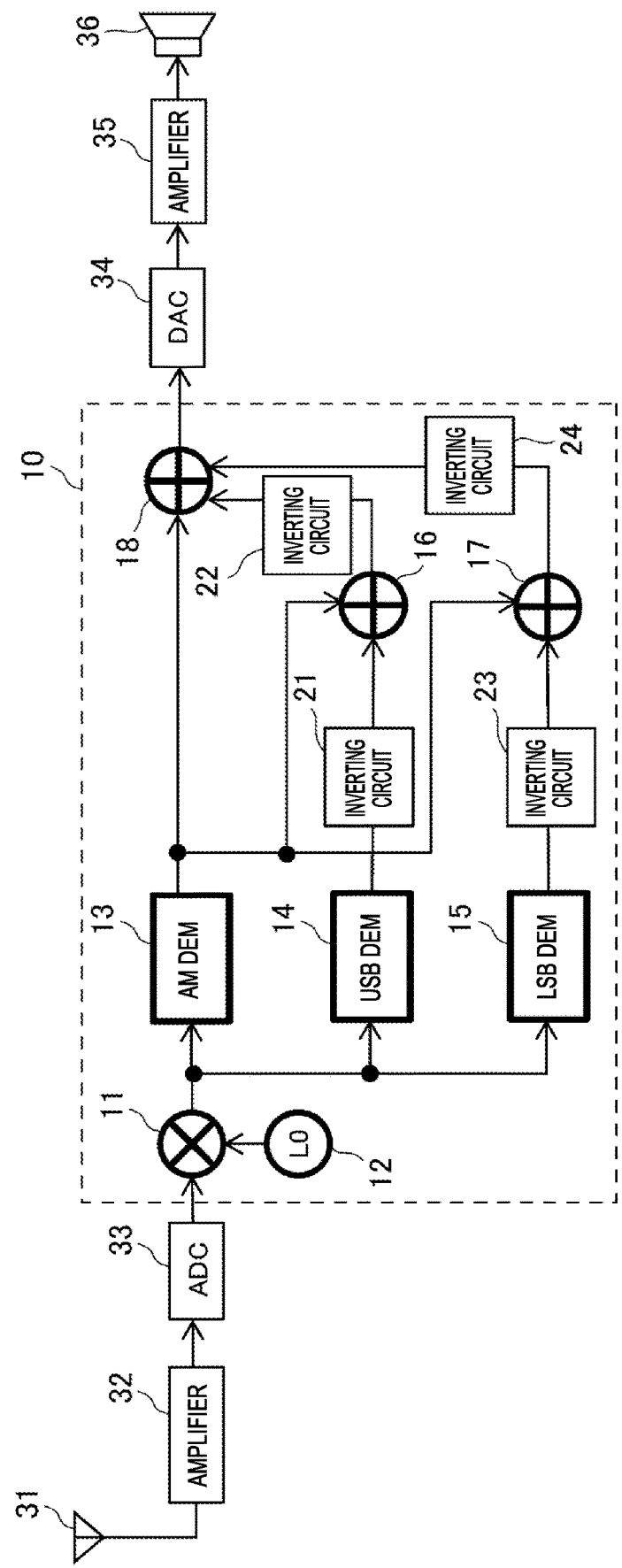
FIG. 1 is a block diagram showing a configuration of a receiving device and a receiving system according to an embodiment.

FIG. 1 is a block diagram showing a configuration of the receiving device and the receiving system according to the embodiment. The receiving device of the present embodiment includes a demodulation processor 10 that demodulates a radio signal such as AM radio broadcasting. The receiving system of the present embodiment includes, as a reception signal input circuit, an antenna 31, an amplifier 32, and an A/D converter (ADC: Analog to Digital Converter) 33. Further, the receiving system includes, as a sound signal output circuit, a D/A converter (DAC: Digital to Analog Converter) 34, an amplifier 35, and a speaker 36.

The antenna 31 receives a radio signal such as AM radio broadcasting. The amplifier 32 is an example of an input signal amplifier, and includes an amplifier that amplifies an RF (radio frequency band) reception signal. The A/D converter 33 converts the RF reception signal from an analog signal to a digital signal, and inputs the digital signal to the demodulation processor 10. The reception signal input circuit may be configured by an input interface or the like for inputting a reception signal of a radio wave of a desired wave.

The D/A converter 34 converts a demodulation signal of a digital signal output from the demodulation processor 10 into an analog signal. The amplifier 35 is an example of an output signal amplifier, and includes an amplifier that amplifies an audio signal obtained by converting the demodulation signal into the analog signal. The speaker 36 is an example of a sound output device, reproduces and outputs a sound signal, and reproduces a sound such as AM radio broadcasting. The sound output device is not limited to the speaker 36, and various devices such as a headphone, an earphone, and a headset may be used. The sound signal output circuit may be configured by an output interface or the like for outputting a sound signal of a demodulation signal.

The demodulation processor 10 includes a frequency mixer (Mixer) 11, a Local Oscillator (LO) 12, an envelope demodulator (AM DEM) 13, an upper sideband demodulator (USB DEM) 14, a lower sideband demodulator (LSB DEM) 15, adders 16, 17, 18 and inverting circuits 21, 22, 23, 24. The demodulation processor 10 may be implemented by hardware such as an integrated circuit on which a signal processing circuit for executing processing of each unit is mounted, or at least may be partially implemented by a processor such as a Digital Signal Processor (DSP) and a software program for operating the processor.

The local oscillator 12 includes an oscillator, for example, an Numerical Controlled Oscillator (NCO) or the like, and generates a local signal having the same frequency as a carrier frequency of an RF reception signal. The frequency mixer 11 performs mixing processing by multiplying the reception signal of the RF digital signal (digital reception signal) input from the A/D converter 33 with the local signal output from the local oscillator 12, and frequency-converts the digital reception signal into a reception signal in a baseband (reception baseband signal). The reception signal in the baseband is input to the envelope demodulator 13, the upper sideband demodulator 14, and the lower sideband demodulator 15, respectively.

The envelope demodulator 13 includes, for example, a demodulation circuit such as an envelope detector, constitutes a so-called AM demodulator, and demodulates the reception signal by envelope detection. The upper sideband demodulator 14 has, for example, a Single Side Band (SSB) demodulation circuit, and demodulates only an upper sideband of the reception signal by SSB synchronous demodulation. The upper sideband demodulator 14 multiplies the reception signal by a clock signal serving as a synchronization signal synchronized with a carrier wave, and shifts a phase by 90 degrees by a 90-degree phase shifter so as to extract and demodulate only the upper sideband. The lower sideband demodulator 15 includes, for example, an SSB demodulation circuit, and demodulates only a lower sideband of the reception signal by SSB synchronous demodulation. The lower sideband demodulator 15 multiplies the reception signal by a clock signal serving as a synchronization signal synchronized with a carrier wave, and shifts a phase by 90 degrees in a direction opposite to the upper sideband demodulator 14 by the 90-degree phase shifter so as to extract and demodulate only the lower sideband.

The inverting circuits 21, 22, 23, 24 serve as first to fourth inverting circuits, respectively, and each of the inverting circuits 21, 22, 23, 24 includes, for example, a phase inverter, and invert +/−polarity of an input signal by inverting a phase of the input signal. The inverting circuit 21 inverts the output from the upper sideband demodulator 14. The inverting circuit 23 inverts the output from the lower sideband demodulator 15.

The adder 16 is an example of a first adder, and receives and adds the output from the envelope demodulator 13 and the output from the inverting circuit 21. That is, the adder 16 adds the output from envelope demodulator 13 and the inverted output from the upper sideband demodulator 14. The adder 17 is an example of a second adder, and receives and adds the output from the envelope demodulator 13 and the output from the inverting circuit 23. That is, the adder 17 adds the output from the envelope demodulator 13 and the inverted output from the lower sideband demodulator 15. The inverting circuit 22 inverts the output from the adder 16. The inverting circuit 24 inverts the output from the adder 17.

The adder 18 is an example of a third adder, receives and adds the output from the envelope demodulator 13, the output from the inverting circuit 22, and the output from the inverting circuit 24, and outputs a demodulation signal.

Figure 2:
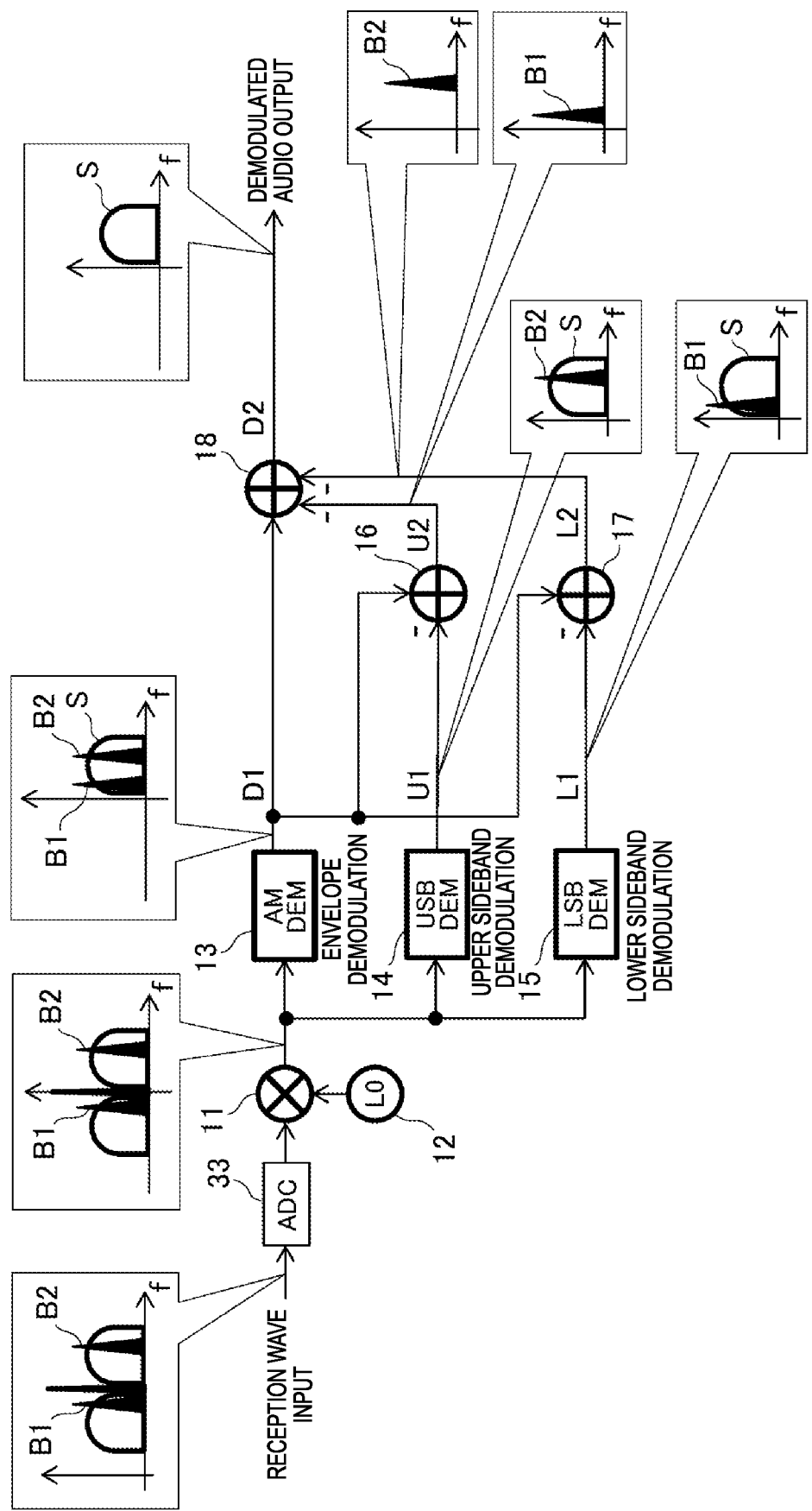
FIG. 2 is a diagram showing an operation of the receiving device according to the embodiment.
Figure 3:
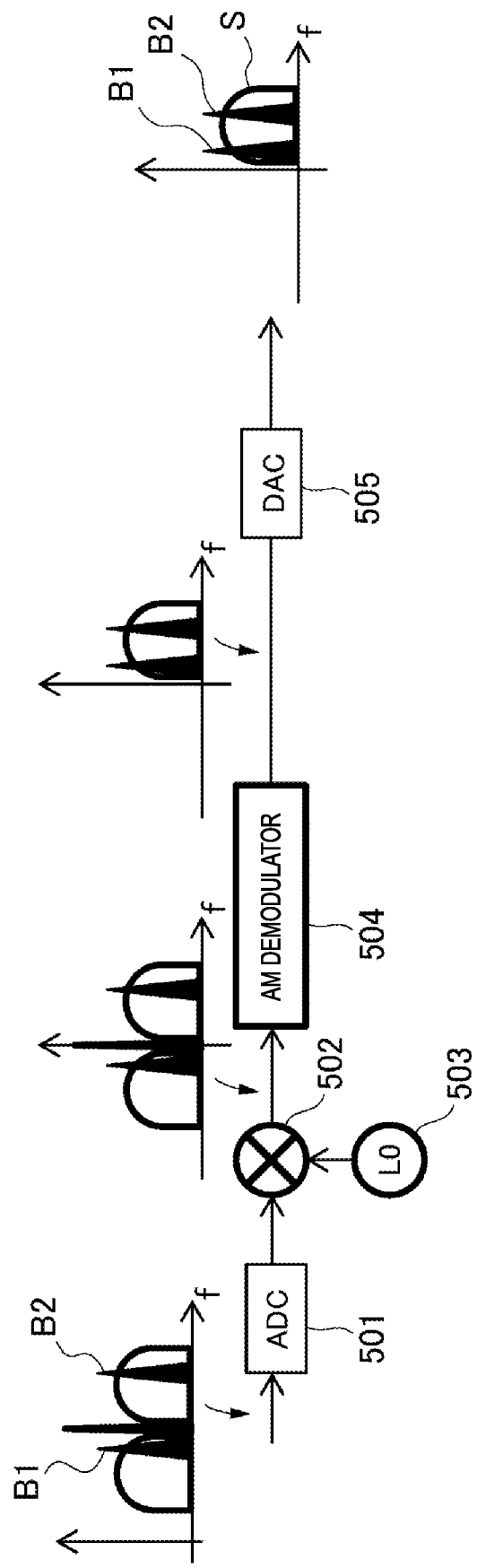
FIG. 3 is diagram showing an operation when a noise is mixed in an AM radio receiver.
Figure 4:
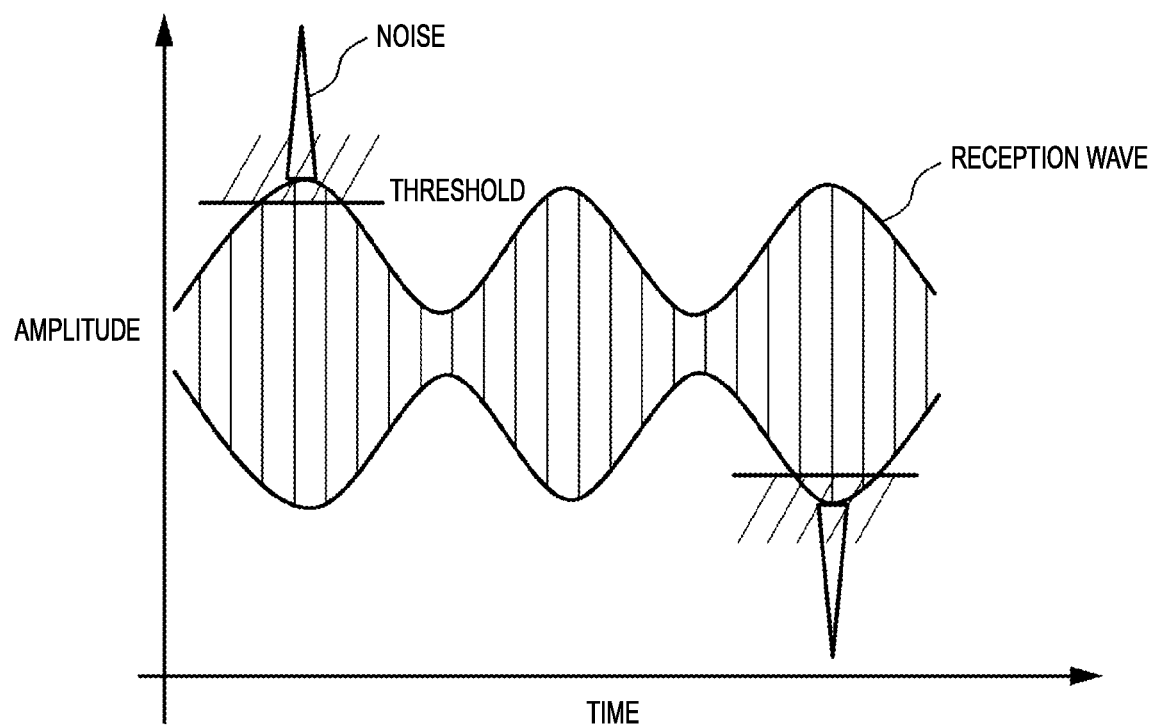
FIG. 4 is a waveform diagram showing a noise cancelling operation in the related art.

FIG. 2 is a diagram showing an operation of the receiving device according to the embodiment. The operation of the receiving device and a procedure of the receiving method according to the present embodiment will be described with reference to FIG. 2. Here, an operation is shown in a case where a beat noise is mixed in a radio signal and two types of beat noises B1, B2 are superimposed in a reception signal of reception wave input received by the antenna 31. In the illustrated example, the beat noise B1 is mixed in the lower sideband, and the beat noise B2 is mixed in the upper sideband.

In the present embodiment, on an output side of the frequency mixer 11, the upper sideband demodulator 14 and the lower sideband demodulator 15 are additionally provided besides the envelope demodulator 13, and the adders 16, 17, 18 and inverting circuits 21, 22, 23, 24 for subtracting the output of the upper sideband demodulator 14 and the lower sideband demodulator 15 from the output of the envelope demodulator 13 are provided.

A radio signal of an AM broadcast wave serving as a desired wave has a spectrum in which an upper sideband and a lower sideband are symmetrical with respect to a carrier signal on a frequency axis, but in a radio signal including a noise, a spectrum of the signal is not symmetrical between the upper sideband and the upper sideband. In the present embodiment, a noise component is extracted by extracting a component that is asymmetrical between the upper sideband and the lower sideband. Then, only the noise component is canceled by subtracting the noise component from the envelope demodulation signal of the radio signal.

In the envelope demodulation of the reception signal performed by the envelope demodulator (AM DEM) 13, the noises contained in the upper sideband and the lower sideband are demodulated together with the broadcast wave of the desired wave, and a demodulation signal including the noise is output. Therefore, in a signal D1 which has been processed by the envelope demodulation by the envelope demodulator 13, the beat noise B1 and the beat noise B2 are superimposed on an audio signal S obtained by demodulating both sideband waves, and the signal D1=(S+B1+B2) is output from the envelope demodulator 13.

A signal U1 which has been processed by the upper sideband demodulation by the upper sideband demodulator (USB DEM) 14 contains the audio signal S obtained by demodulating only the upper sideband by the single sideband demodulation and the beat noise B2. Therefore, the signal U1=(S+B2) is output from the upper sideband demodulator 14. Further, by inverting a phase via the inverting circuit 21, a signal −U1=(−S−B2) is obtained.

A signal L1 which has been processed by the lower sideband demodulation by the lower sideband demodulator (LSB DEM) 15 contains the audio signal S obtained by demodulating only the lower sideband by the single sideband demodulation and the beat noise B1. Therefore, the signal L1=(S+B1) is output from the lower sideband demodulator 15. Further, by inverting a phase via the inverting circuit 23, the signal −L1=(−S−B1) is obtained.

Next, by adding the signal D1 and the signal −U1 by the adder 16, the beat noise B1 is extracted. In addition, by adding the signal D1 and the signal −L1 by the adder 17, the beat noise B2 is extracted. An output signal U2 from the adder 16 is U2=U1+D1=(−S−B2)+(S+B1+B2)=B1. An output signal L2 of the adder 17 is L2=−L1+D1=(−S−B1)+(S+B1+B2)=B2.

As described above, by obtaining a difference between the envelope demodulation signal and the upper sideband demodulation signal or lower sideband demodulation signal respectively demodulated by the single sideband demodulation, it is possible to extract only a noise component of the beat noise of the upper sideband or the lower sideband.

Further, by inverting a phase via the inverting circuit 22, a signal −U2=−B1 is obtained. By inverting a phase via the inverting circuit 24, a signal −L2=−B2 is obtained. Then, by adding the signal D1, the signal −U2 and the signal −L2 by the adder 18, only the audio signal S is extracted. An output signal D2 from the adder 18 is D2=D1−U2−L2=(S+B1+B2)−B1−B2=S.

As described above, the noise components of the upper sideband and the lower sideband extracted as described above are subtracted from the envelope demodulation signal, and thus it is possible to cancel only the beat noise from the demodulation signal of the radio signal of the reception wave.

In a case where the configuration of the present embodiment is applied to an actual device, a delay device that absorbs a delay in processing time required in each process is required, but the description thereof is omitted here because the description is complicated.

By the above processing, a demodulation signal obtained by extracting only the audio signal S of the desired wave is output as a demodulated audio output. According to the present embodiment, it is possible to provide an AM reception noise canceller that can eliminate only a signal component of the beat noise without affecting original audio information.

According to the present embodiment, the beat noise can be cancelled under a condition that there is a noise that interferes with a receiving device such as an AM radio receiver to generate a beat noise, for example, a motor noise of an electric vehicle and a clock noise inside the receiver or the like. For example, when the motor is driven by a PWM signal, a noise mixed in a reception signal can be removed even for a noise source whose frequency and amplitude change in conjunction with the motor. Therefore, in a receiving system including an AM radio receiver or the like, it is possible to output a good sound signal of a desired wave with little deterioration in sound quality.

As described above, the receiving device of the present embodiment includes the frequency mixer 11 configured to mix a reception signal received from the antenna 31 and a local signal generated by the local oscillator 12 to convert a frequency of the reception signal to a baseband. The receiving device includes the envelope demodulator 13 configured to perform envelope demodulation of the output from the frequency mixer 11, the upper sideband demodulator 14 configured to demodulate only the upper sideband of the output from the frequency mixer 11 by the single sideband demodulation, and the lower sideband demodulator 15 configured to demodulate only the lower sideband of the output from the frequency mixer 11 by single sideband demodulation. Further, the receiving device includes the adder 16 configured to add the output from the envelope demodulator 13 and the inverted output obtained by inverting the output from the upper sideband demodulator 14, the adder 17 configured to add the output from the envelope demodulator 13 and the inverted output obtained by inverting the output from the lower sideband demodulator 15, and the adder 18 configured to add the output from the envelope demodulator 13, the inverted output obtained by inverting the output from the adder 16 and the inverted output obtained by inverting the output from the adder 17, and to output a demodulation signal.

In the above configuration, by adding the envelope demodulation signal and the inverted output of the upper sideband demodulation signal, the noise component included in the lower sideband of the reception signal can be extracted. Further, by adding the envelope demodulation signal and the inverted output of the lower sideband demodulation signal, the noise component included in the upper sideband of the reception signal can be extracted. Then, by adding the envelope demodulation signal and the inverted output of the extracted lower and upper sideband noise components, the noise components included in the upper and lower sidebands can be canceled from the envelope demodulation output of the reception signal. Thus, it is possible to output the demodulation signal obtained by removing only the noise component from the reception signal to extract the audio signal of the desired wave. Therefore, it is possible to provide an AM reception noise canceller that can remove only a signal component of a beat noise without affecting original audio information of the reception signal even if the noise occurs.

The receiving system of the present embodiment includes the reception signal input circuit configured to input a reception signal of a radio wave, a demodulation processor 10 configured to perform demodulation processing of the reception signal, and the sound signal output circuit configured to sound-output a demodulated signal. The reception signal input circuit includes the antenna 31 configured to receive a radio wave of a desired wave and an amplifier 32 configured to amplify a received signal. The sound signal output circuit includes the amplifier 35 configured to amplify a demodulated signal, and the speaker 36 configured to output an amplified signal as a sound signal. The demodulation processor 10 includes a frequency mixer 11 configured to mix a reception signal input from the reception signal input circuit and a local signal generated by the local oscillator 12 to convert a frequency of the reception signal to a baseband, the envelope demodulator 13 configured to perform envelope demodulation of the output from the frequency mixer 11, the upper sideband demodulator 14 configured to demodulate only the upper sideband of the output from the frequency mixer 11 by the single sideband demodulation, and the lower sideband demodulator 15 configured to demodulate only the lower sideband of the output from the frequency mixer 11 by the single sideband demodulation. Further, the demodulation processor 10 includes the adder 16 configured to add the output from the envelope demodulator 13 and the inverted output obtained by inverting the output from the upper sideband demodulator 14, the adder 17 configured to add the output from the envelope demodulator 13 and the inverted output obtained by inverting the output from the lower sideband demodulator 15, and the adder 18 configured to add the output from the envelope demodulator 13, the inverted output obtained by inverting the output from the adder 16 and the inverted output obtained by inverting the output from the adder 17, to output a demodulation signal.

Thus, it is possible to output the demodulation signal obtained by removing only the noise component from the reception signal to extract the audio signal of the desired wave. Therefore, it is possible to provide a receiving system in which it is possible to cancel only a signal component of a beat noise without affecting the original audio information of the reception signal even if the noise occurs, and it is possible to output a good sound signal with little deterioration in sound quality.

Further, the receiving method of the present embodiment includes causing the frequency mixer 11 to mix the reception signal input thereto and the local signal generated by the local oscillator 12 to convert the frequency of the reception signal to a baseband, and causing the envelope demodulator 13 to perform the envelope demodulation of the output from the frequency mixer 11. The receiving method further includes causing the upper sideband demodulator 14 to demodulate only the upper sideband of the output from the frequency mixer 11 by the single sideband demodulation, and causing the lower sideband demodulator 15 to demodulate only the lower sideband of the output from the frequency mixer 11 by the single sideband demodulation. The receiving method further includes causing the adder 16 to add the output from the envelope demodulator 13 and the inverted output obtained by inverting the output from the upper sideband demodulator 14, and causing the adder 17 to add the output from the envelope demodulator 13 and the inverted output obtained by inverting the output from the lower sideband demodulator 15. The receiving method further includes causing the adder 17 to add the output from the envelope demodulator 13, the inverted output obtained by inverting the output from the adder 16, and the inverted output obtained by inverting the output from the adder 17, to output a demodulation signal.

As a result, since it is possible to output the demodulation signal obtained by removing only the noise component from the reception signal to extract the audio signal of the desired wave, and it is possible to cancel only a signal component of a beat noise without affecting an original audio information of the reception signal even if the noise occurs.

Although various embodiments have been described above with reference to the drawings, it is needless to say that the present disclosure is not limited to such examples. It is obvious that a person skilled in the art can conceive various modifications or corrections within the scope defined by the claims, and such modifications or corrections shall be regarded as belonging to the technical scope of the present disclosure. In addition, the components according to the above-described embodiments may be freely combined with one another, without departing from the scope of the present disclosure.

This application is based on Japanese Patent Application No. 2018-066238 filed Mar. 29, 2018, the contents of which are incorporated herein by reference.

The present disclosure is useful as a receiving device, a receiving method, and a receiving system capable of removing only a noise without affecting the original audio information even when the noise occurs.

The invention claimed is:

1. A receiving device comprising:
   a frequency mixer configured to mix a reception signal input thereto and a local signal generated by a local oscillator to convert a frequency of the reception signal to a baseband;
   an envelope demodulator configured to perform envelope demodulation of an output from the frequency mixer;
   an upper sideband demodulator configured to demodulate only an upper sideband of the output from the frequency mixer by single sideband demodulation;
   a lower sideband demodulator configured to demodulate only a lower sideband of the output from the frequency mixer by the single sideband demodulation;
   a first adder configured to add an output from the envelope demodulator and a first inverted output obtained by inverting an output from the upper sideband demodulator;
   a second adder configured to add the output from the envelope demodulator and a first inverted output obtained by inverting an output from the lower sideband demodulator; and
   a third adder configured to add the output from the envelope demodulator, a third inverted output obtained by inverting an output from the first adder, and a fourth inverted output obtained by inverting an output from the second adder, to output a demodulation signal.

2. The receiving device according to claim 1, wherein the upper sideband demodulator comprises a first 90-degree phase shifter configured to shift, by 90 degrees, a phase of a signal obtained by multiplying the output from the frequency mixer by a synchronization signal synchronized with a carrier wave, and
wherein the lower sideband demodulator comprises a second 90-degree phase shifter configured to shift, by 90 degrees in a direction opposite to that of the first phase shifter, the phase of the signal obtained by multiplying the output from the frequency mixer by the synchronization signal.

3. The receiving device according to claim 1, further comprising:
   a first inverting circuit configured to invert the output from the upper sideband demodulator to generate the first inverted output;
   a second inverting circuit configured to invert the output from the lower sideband demodulator to generate the second inverted output;
   a third inverting circuit configured to invert the output from the first adder to generate the third inverted output; and
   a fourth inverting circuit configured to invert the output from the second adder to generate the fourth inverted output.

4. The receiving device according to claim 3, wherein each of the first inverting circuit, the second inverting circuit, the third inverting circuit and the fourth inverting circuit comprises a phase inverter configured to invert polarity of an input signal by inverting a phase of the input signal.

5. The receiving device according to claim 1, comprising:
   a processor; and
   a memory storing a program,
   wherein the program, when executed by the processor, causes the processor to execute at least part of processing performed by the frequency mixer, the envelope demodulator, the upper sideband demodulator, the lower sideband demodulator, the first adder, the second adder and the third adder.

6. The receiving device according to claim 1, wherein the receiving device is mounted on a vehicle.

7. A receiving system comprising:
   a reception signal input circuit configured to input a reception signal of a radio wave;
   a demodulation processor configured to perform demodulation processing of the reception signal; and
   a sound signal output circuit configured to sound-output a demodulation signal,
   wherein the reception signal input circuit comprises an antenna configured to receive a radio wave of a desired wave and an input signal amplifier configured to amplify a received signal, wherein the sound signal output circuit comprises an output signal amplifier configured to amplify the demodulation signal, and a sound output device configured to output an amplified signal as a sound signal, and wherein the demodulation processor comprises:
a frequency mixer configured to mix the reception signal input from the reception signal input circuit and a local signal generated by a local oscillator to convert a frequency of the reception signal to a baseband;
an envelope demodulator configured to perform envelope demodulation of an output from the frequency mixer;
an upper sideband demodulator configured to demodulate only an upper sideband of the output from the frequency mixer by single sideband demodulation;
a lower sideband demodulator configured to demodulate only a lower sideband of the output from the frequency mixer by the single sideband demodulation;
a first adder configured to add an output from the envelope demodulator and a first inverted output obtained by inverting an output from the upper sideband demodulator;
a second adder configured to add the output from the envelope demodulator and a second inverted output obtained by inverting an output from the lower sideband demodulator; and
a third adder configured to add the output from the envelope demodulator, a third inverted output obtained by inverting an output from the first adder, and a fourth inverted output obtained by inverting an output from the second adder, to output the demodulation signal.

8. The receiving system according to claim 7,
wherein the upper sideband demodulator comprises a first 90-degree phase shifter configured to shift, by 90 degrees, a phase of a signal obtained by multiplying the output from the frequency mixer by a synchronization signal synchronized with a carrier wave, and
wherein the lower sideband demodulator comprises a second 90-degree phase shifter configured to shift, by 90 degrees in a direction opposite to that of the first phase shifter, the phase of the signal obtained by multiplying the output from the frequency mixer by the synchronization signal.

9. The receiving system according to claim 7,
wherein the demodulation processer further comprises:
a first inverting circuit configured to invert the output from the upper sideband demodulator to generate the first inverted output;
a second inverting circuit configured to invert the output from the lower sideband demodulator to generate the second inverted output;
a third inverting circuit configured to invert the output from the first adder to generate the third inverted output; and
a fourth inverting circuit configured to invert the output from the second adder to generate the fourth inverted output.

10. The receiving system according to claim 9,
wherein each of the first inverting circuit, the second inverting circuit, the third inverting circuit and the fourth inverting circuit comprises a phase inverter configured to invert polarity of an input signal by inverting a phase of the input signal.

11. The receiving system according to claim 7, comprising:
a processor; and
a memory storing a program,
wherein the program, when executed by the processor, causes the processor to execute at least part of processing performed by the demodulation processor.

12. The receiving system according to claim 7,
wherein the receiving device is mounted on a vehicle.

13. The receiving system according to claim 7,
wherein the reception signal input circuit further comprises an analog-to-digital converter configured to convert an output from the input signal amplifier from an analog signal to a digital signal to generate the reception signal input to the demodulation processor, and
wherein the sound signal output circuit further comprises a digital-to-analog converter configured to convert the demodulation signal output from the demodulation processor from a digital signal to an analog signal to generate a signal input to the output signal amplifier.

14. The receiving system according to claim 7,
wherein the sound output device comprises a speaker.

15. A receiving method comprising:
causing a frequency mixer to mix a reception signal input thereto and a local signal generated by a local oscillator to convert a frequency of the reception signal to a baseband;
causing an envelope demodulator to perform envelope demodulation of an output from the frequency mixer;
causing an upper sideband demodulator to demodulate only an upper sideband of the output from the frequency mixer by single sideband demodulation;
causing a lower sideband demodulator to demodulate only a lower sideband of the output from the frequency mixer by the single sideband demodulation;
causing a first adder to add an output from the envelope demodulator and a first inverted output obtained by inverting an output from the upper sideband demodulator;
causing a second adder to add the output from the envelope demodulator and a second inverted output obtained by inverting an output from the lower sideband demodulator; and
causing a third adder to add the output from the envelope demodulator, a third inverted output obtained by inverting an output from the first adder, and a fourth inverted output obtained by inverting an output from the second adder, to output a demodulation signal.

16. The receiving method according to claim 15,
wherein the single sideband demodulation performed by the upper sideband demodulator comprises: multiplexing the output from the frequency mixer by a synchronization signal synchronized with a carrier wave; and shifting a phase of a multiplied signal by 90 degrees, and
wherein the single sideband demodulation performed by the lower sideband demodulator comprises: multiplexing the output from the frequency mixer by the synchronization signal; and shifting a phase of a multiplied signal by 90 degrees in a direction opposite to that of the upper sideband demodulator.

17. The receiving method according to claim 15, further comprising:
causing a first inverting circuit to invert the output from the upper sideband demodulator to generate the first inverted output;

causing a second inverting circuit to invert the output from the lower sideband demodulator to generate the second inverted output;
causing a third inverting circuit to invert the output from the first adder to generate the third inverted output; and
causing a fourth inverting circuit to invert the output from the second adder to generate the fourth inverted output.

18. The receiving method according to claim 17,
wherein generation of each of the first inversion output, the second inversion output, the third inversion output and the fourth inversion output comprises causing a phase inverter to invert polarity of an input signal by inverting a phase of the input signal.

* * * * *